United States Patent [19]

Reggiani et al.

[11] 4,100,510
[45] Jul. 11, 1978

[54] STABILIZATION SYSTEMS FOR IMPATT DIODE MICROWAVE OSCILLATORS OR AMPLIFIERS, AND SIMILAR ACTIVE COMPONENTS

[75] Inventors: Marcello Reggiani; Franco Marchetti, both of Rome, Italy

[73] Assignee: Selenia-Industrie Elettroniche Associate S.p.A., Italy

[21] Appl. No.: 826,795

[22] Filed: Aug. 22, 1977

Related U.S. Application Data

[63] Continuation of Ser. No. 694,856, Jun. 10, 1976.

[30] Foreign Application Priority Data

Jul. 7, 1975 [IT] Italy ............................... 50398 A/75

[51] Int. Cl.² ............................................. H03B 7/14
[52] U.S. Cl. ................................. 331/107 R; 331/101; 331/105
[58] Field of Search ................... 331/96, 99, 101, 102, 331/100, 107 R, 107 G, 107 T, 105

[56] References Cited

U.S. PATENT DOCUMENTS

| 3,168,713 | 2/1965 | Van Kessel | 331/105 |
| 3,274,513 | 9/1966 | Gregory | 331/101 |
| 3,534,293 | 10/1970 | Harkless | 331/101 |
| 3,792,375 | 2/1974 | Brackett | 331/96 |
| 3,838,356 | 9/1974 | Knerr | 331/101 |
| 3,842,370 | 10/1974 | Fong | 331/101 |

OTHER PUBLICATIONS

IEEE Trans., Micro. Theory, vol. MTT17, No. 12, Dec. 1969 "Circuits for High-Eff. Aval. Diode Oscillators," W. J. Evans.
IEEE Jn. of Solid State Circ., vol. SC-5, No. 6, Dec., 1970, "FM Phase-Locked IMPATT Power Combiner," I. Tatsuguchi.
IEEE Trans. Micro. Theory, vol. MTT20, No. 12, Dec. 1972, "K Band . . . IMPATT Osc. . . . " Ito et al.

*Primary Examiner*—John Kominski
*Attorney, Agent, or Firm*—Beveridge, DeGrandi, Kline & Lunsford

[57] ABSTRACT

A stabilization system for IMPATT diode microwave oscillators, comprising: means for electrical and mechanical support of said IMPATT diode, forming the return conductor of the feeding, the thermal dissipator and the terminal of a transmission line; a power supply feeding conductor for said diode comprising a substantially filamentary conducting element, inductively associated for a portion thereof to a ferrite, said ferrite being characterized in having high losses in the frequency spectrum where spurious oscillations might appear, and practically neglectable losses at the operating frequencies of said IMPATT diode.

7 Claims, 13 Drawing Figures

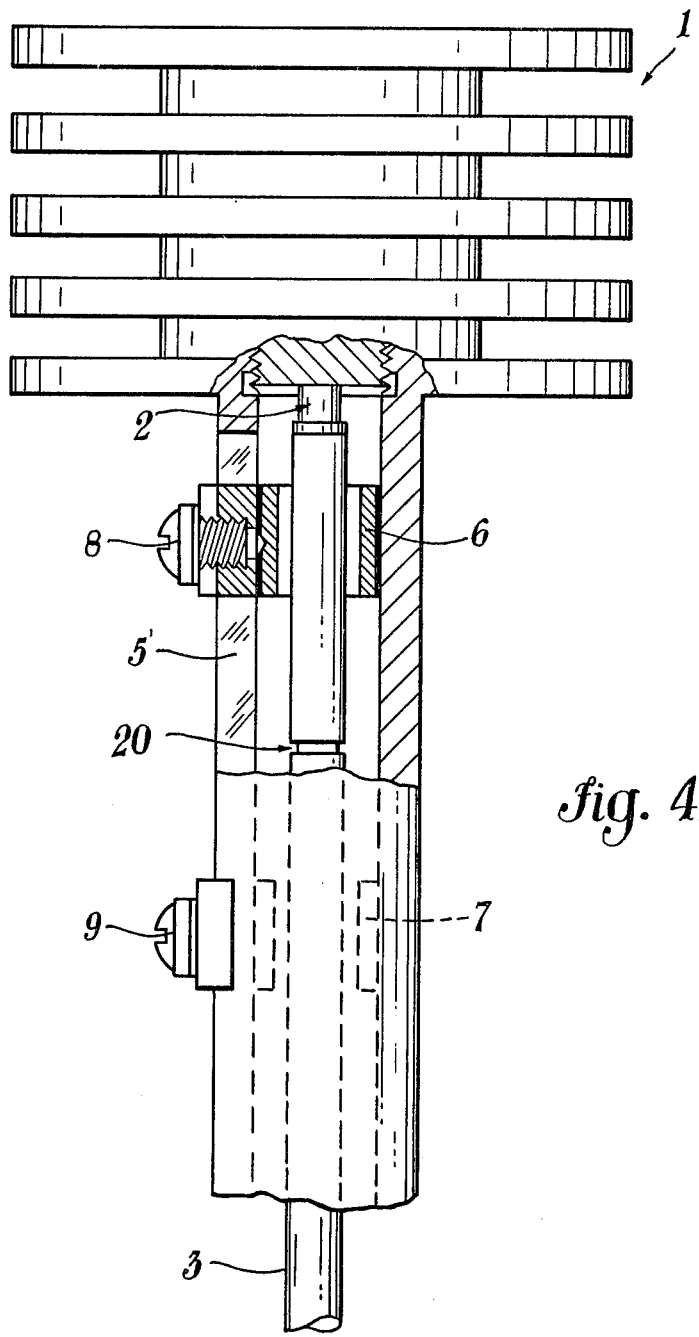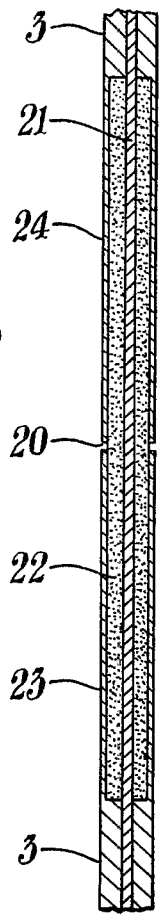
fig. 4b
fig. 4a

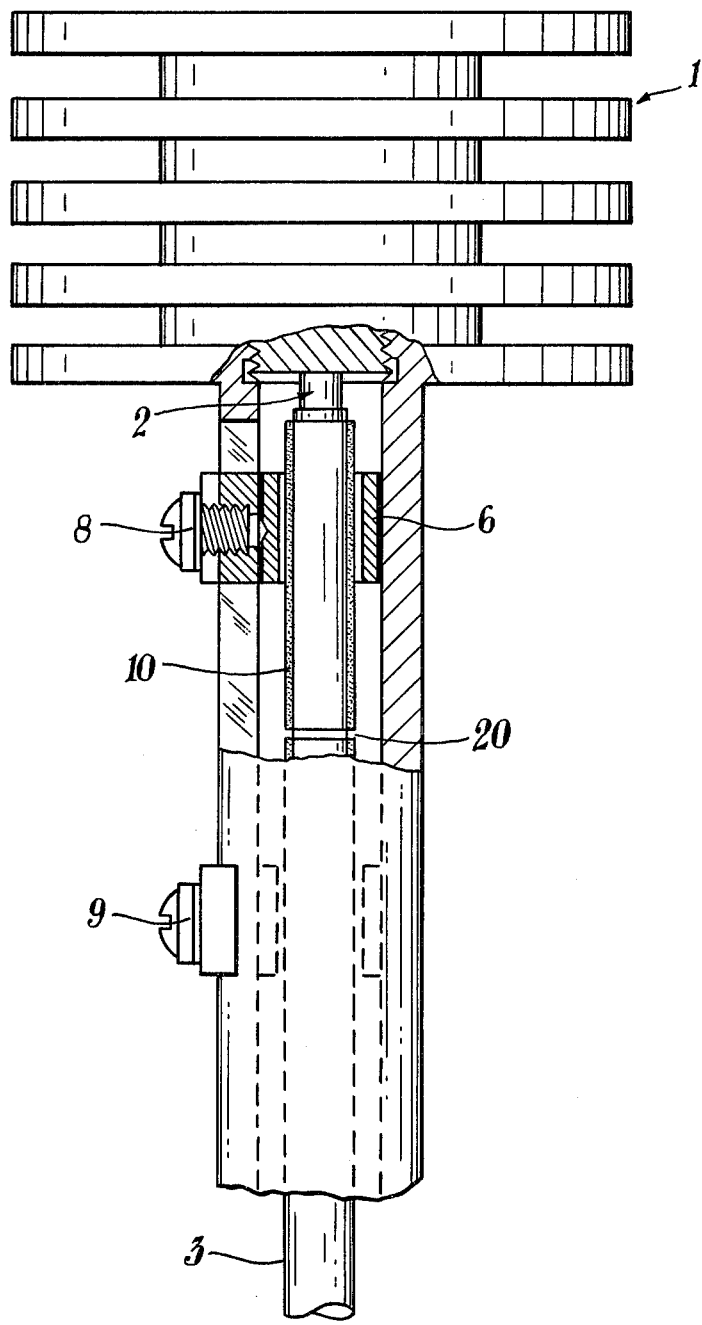
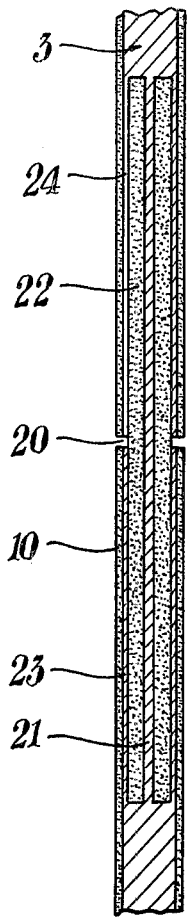
Fig. 6a
Fig. 6b

Fig. 8a
Fig. 8b
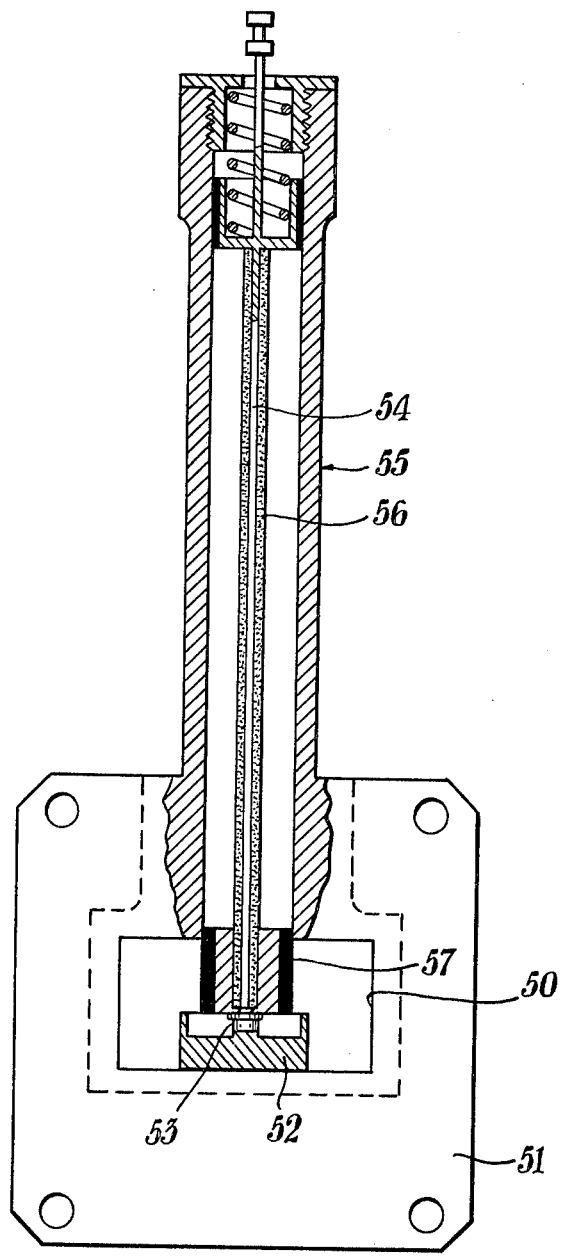
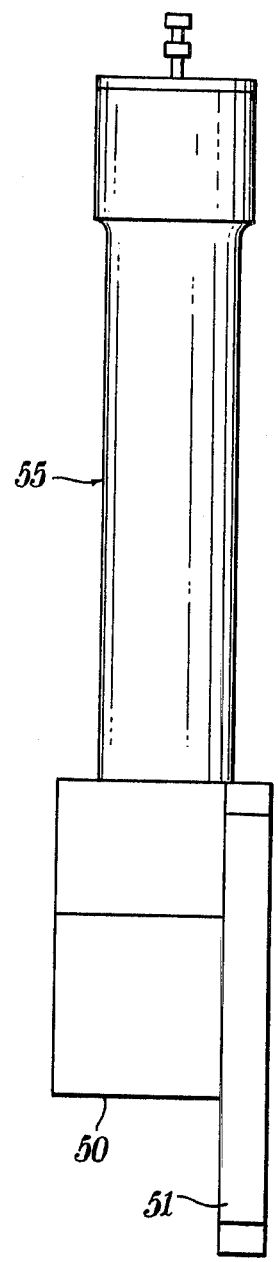

Fig. 9a
Fig. 9b
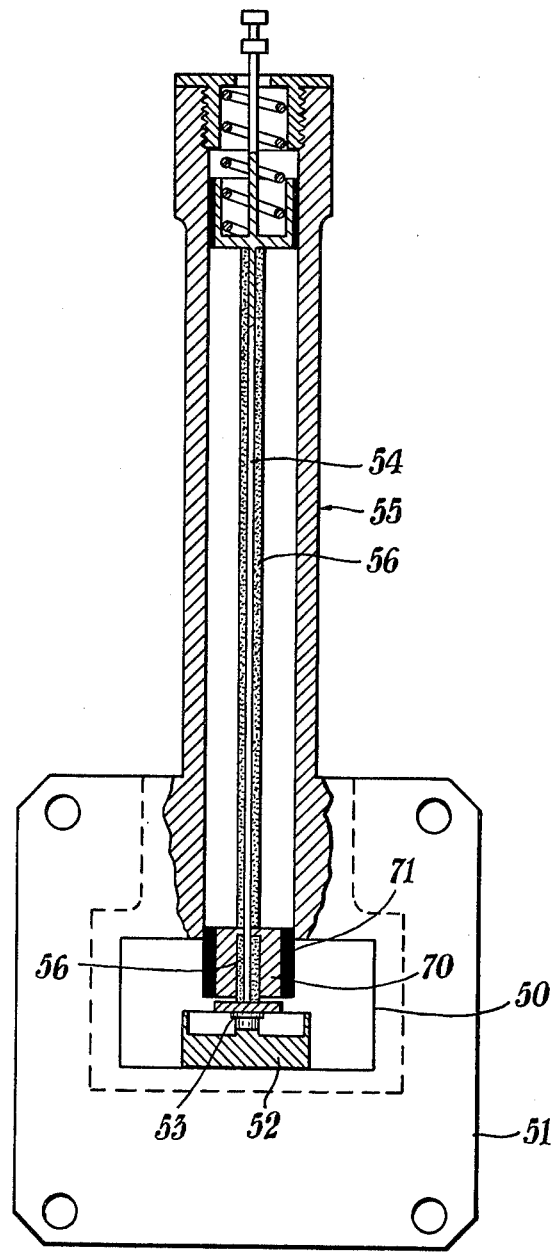
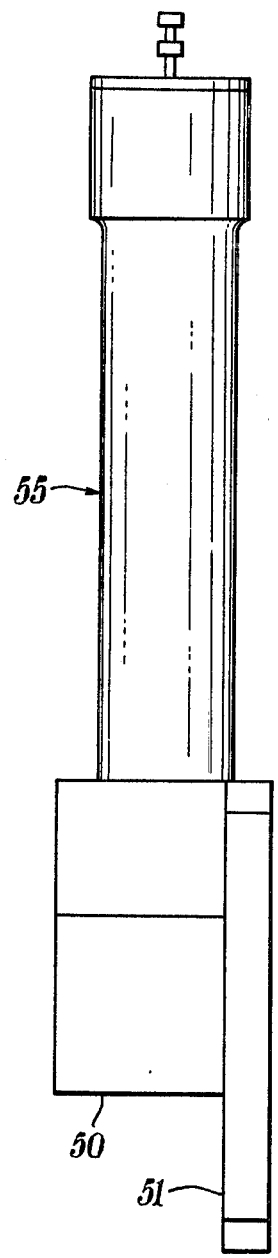

STABILIZATION SYSTEMS FOR IMPATT DIODE MICROWAVE OSCILLATORS OR AMPLIFIERS, AND SIMILAR ACTIVE COMPONENTS

This is a continuation of application Ser. No. 694,856 filed Jun. 10, 1976 by Marcello Reggiani et al.

The present invention relates to an improvement in the stabilization systems for IMPATT diode microwave oscillators or amplifiers and similar active components.

Field of the invention

The present invention relates to the technique of microwave oscillation and particularly microwave power generation by solid state devices. Even though the present invention will be described with reference to IMPATT diode oscillators or amplifiers, the invention itself can be used in analogous cases.

The stabilizing system according to the present invention has a particular importance not only in case of oscillators having a relative high power as it allows a greater safety margin against the burn out of the diode due to phenomena of instability, such as the parasitic oscillations having a relatively low frequency, but it has also a great importance in case of reduced power since in any case it allows a remarkable improvement in respect of the noise, and in that it avoids the appearance of output spurious signals.

The phenomenon rendering the design of IMPATT diode oscillators more difficult than that of the other negative resistance oscillators is due to the insurgence of low frequency negative resistance, as a consequence of the existence of a radio frequency oscillation. The phenomenon depends upon the rectifying characteristic of the IMPATT diode, and accordingly it depends upon the physical structure itself of the diode. Accordingly, the drawbacks due to the appearance of the low frequency negative resistance cannot be avoided by other means than circuitry contrivances. The existence of this phenomenon has been well known since the first studies on avalanche diodes, so that Read himself (who first proposed the use of the IMPATT diode) discussed and established the equation governing the rectification effect (W. T. Read, Jr. "A proposed High Frequency Negative Resistance Diode", Bell System Tech. J., 37, P. 401, 1958). The formula is as follows:

$$V_d = AI_d - BV_a^2 + C \quad (1)$$

where $I_d$ is the direct current supply at the IMPATT diode terminals, $V_d$ is the corresponding dc voltage at the diode terminals, $V_a$ is the radiofrequency voltage at the diode terminals; and A, B, C are parameters depending upon the semiconductor of which the diode is made.

From formula (1), by differentiation of $V_d$ with respect to $I_d$ and subsequent processing, we obtain:

$$R_t = R_{sc} - 2B1/G \, dP/di_d \quad (2)$$

where $R_t$ is the low frequency differential resistance seen at the diode terminals; $R_{sc}$ is the space charge resistance deducted from the slope of the characteristics V, I of the diode in the constant temperature break-down zone; since the characteristic V,I in this zone, is practically linear, said $R_{sc}$ is a constant depending upon the characteristics of the semiconductor of which the diode is made; G is the conductance of the microwave circuit measured at the diode terminals, at the microwave oscillation frequency; P is the microwave output radiofrequency power.

In the normal operating condictions the term $2B \, 1/G \, dP/dI_d$ is greater than $R_{sc}$ and therefore $R_t$ is negative.

The explanation of the occurrence of the low frequency negative resistance is as follows: the radiofrequency current which circulates through the diode, is rectified and originates an average value of the voltage at its terminals, different from zero.

This average value will sum up to the dc voltage appearing at the terminals of the diode determining the lowering thereof. The radiofrequency current increases when the bias current increases and therefore the derivative of the voltage at the terminals of the diode, with respect to the supply current is negative. This occurrence can have a rather high speed, whereby the negative resistance at the terminals of the diode will be obtained for frequencies going from the dc to hundreds of MHz and more.

This phenomenon of the occurrence of low frequency negative resistance has been also studied by others, among which Brackett (C.A. Brackett "The Elimination of Tuning Induced Burn-Out and Bias Circuit Oscillations in IMPATT oscillators" Bell System Techn. J., p. 271, 1973).

Once the value of the negtive resistance of the diode at low and intermediate frequencies is known, or, more generally, is known the behaviour of the impedance with the frequency, we shall have, in principle, the elements for calculating a stable bias network.

Practically, the problem is not so simple, as the behaviour of the impedance of the diode in low and intermediate frequencies depends essentially upon the characteristics of the radiofrequency circuit. Therefore, the simple variation of the RF circuit can cause the insurgence of low or intermediate frequency oscillations, with the lamented inconveniences. Finally, the adjustment, the tuning the substitution of one component in an IMPATT diode circuit must be made with an extreme care, with complicated procedures, and can anyway cause the burn out of the diode. A suggested technique in order to obviate the possibility of burn out of the diode and also for avoiding the occurrence of spurious oscillations, consists in carrying out the tuning of the oscillator circuit starting from very low values of the supply current, and increasing the current in small steps alternated by tuning operations. If in the tuning operation a spurious oscillation tends to be originated, one must come back to the start position and continue the tuning varying another element and so along. The process is not sure as the occurrence of the spurious oscillation can be so quick as to originate the burn out before it will be possible to obviate the inconvenience. This is not, however, a process which can be carried out in the field. Also, this process can imply the impossibility of reaching the maximum supply current (compatible with the over-heating condition of the chip) and, consequently, the maximum performances, also in laboratory.

As from the standpoint of the low frequency circuit, the diode is stable at open circuit, it might appear at a glance, that the inconvenience of the low frequency oscillations might be removed using a constant current power supply having a suitably large band (i.e. a power supply having an internal resistance far greater than the modulus of the negative resistance of the diode for those frequencies for which the anomalous operation as described can appear). Such power supply can be embodied by known techniques also for large frequency bands.

This contrivance, however, does not solve the problem, as in parallel with the power supply, as the terminals of the diode chip, a parasitic reactance due to the microwave circuit is seen, and said reactance, at the lowest frequencies is generally of capacitive type. This reactance cannot be removed, not even in principle as whatever the embodiment of the microwave circuit is, one portion of the bias circuit will have to be common, close to the diode, with a portion of the microwave circuit. This case has been considered by Brackett, but the results as reported by him, considering in assuming that the parallel capacitance typically reaches about a few hundred pF for the normal diodes as used, is not valid for the considered problem. It is in fact possible to show that the capacitances of this order, and also remarkably lower do not ensure generally the immunity of the self-oscillation at the medium and low frequencies.

Other systems for removing the considered inconveniences, such as for instance the insertion of a resistance in series with the feeding of the diode, have no general validity as they are usually located downstream of said parasite capacitance and furthermore they lower the total efficiency of the system.

Summarizing, at the status of the art, prior to the present invention it is impossible to ensure generally the possibility of using oscillators with avalanche diodes with a sufficient margin of safety against burn out, noise and spurious oscillations.

SOLUTION ACCORDING TO THIS INVENTION

The drawback found in the previous attempts of solving the concerned problem depends, finally, upon the fact that in the supply circuit, between the diode and the power supply, a parasitic capacity is interposed in parallel, due to the microwave circuit. Thereto the "line effect" sums up which as shown by Brackett, is always detrimental under the standpoint of the stability. This capacitance and the line effect can be reduced, rendering more difficult the design of the microwave circuit, but they appear not to be removable. Particularly, the capacitance C imposes a constraint on the resistive component R which can be seen at the terminals of the diode, as the relation as follows must be always satisfied;

$$\int_0^\infty R d\omega \leq \frac{\pi}{2c} \quad (3)$$

(See: H. W. Bode "Network Analysis and Feedback Amplifier design" Van Nostrand, Princeton, N.J. 1956, p. 281).

On the other side appears clearly that it will be convenient under the stability standpoint that the integral forming the first member of (3) be as great as possible in order to approach to the ideal supply condition under constant current. Accordingly, the relation (3) implies an effective constraint.

Furthermore, the variation of R with must be slow in order to avoid that the corresponding reactive component will cause worsening of the situation under the standpoint of the stability. The problem is also rendered more difficult by the fact that the law of variation of the impedance presented by the diode depends essentially upon the output power from the diode and the impedance seen in microwaves.

Finally, the stability must be considered not in relation to a single behaviour of the diode impedance, but in relation to a family of impedance behaviours wherein each element of the family depends upon both the supply current and the microwave operation conditions at the desired frequency. The stability must be ensured for each member of said family.

The solution of the problem according to the present invention, consists in using, in the microwave circuit, materials having frequency-depending loss characteristics. Particularly, said material should have neglectable losses in microwave frequency, and relevant losses in the low part of the frequency spectrum.

Therefore, by placing inside the microwave circuit a material having the aforesaid characteristics, the problem of the spurious low-frequency oscillations will be solved, as upstream of the parasite capacitance it will be possible to insert a dissipative element suitable to dampen the unwanted oscillation without influencing the performance of the microwave circuit.

In other words the equivalent resistance, of the dissipative material, interposed between the diode and the parasitic capacity decouples the diode from the capacitance and prevents the oscillation.

Clearly, the lossy material forming said resistance must have a behaviour depending upon the frequency, such that for the operation in microwaves the intorduced dissipation will be neglectable.

A material suitable to this purpose is a ferrite the characteristics of which will be illustrated later on, as well as its physical arrangement in the IMPATT diode oscillator.

In fact several ferrites having low microwave losses (in the absence of an external magnetic field) have high loss values in low and medium frequencies. The phenomena that in certain ferrites originate said losses are widely described in literature, for instance: Y. Naito "Properties of the Magnetic Loss in Ferrites" Electronics and Communications, 53-G No. 9, 1970 page 148 and G.T. Rado "Magnetic Spectra of Ferrites" Rev. of Modern Physics 25, page 81, 1953.

Several types of ferrites are useful for the purposes according to the present invention. By way of example, we cite the Ferrite Selenia G.1 having the characteristics as follows:

| | |
|---|---|
| Saturation magnetization | 1780 Gauss |
| Curie Temperature: | 285° C |
| Average Size of the grains: | 20 microns |
| Width of resonance line: | 50 Oe |
| Dielectric constant at 9.6 GHz: | 15.4 |
| Tangent of the loss angle at 9.3 GHz: | $5.10^{-4}$ |

Other types of ferrites are also suitable for this purpose, for instance:

Type G 113 of Trans-Tech
Type R 171 of Raytheon
Type Y 10 of Thomson-CSF.

The present invention will be now described with reference to certain embodiments thereof at present preferred, disclosed by way of non limitative example, and with reference to the attached drawings wherein:

FIGS. 4a, 4b show a second embodiment of the arrangement according to this invention, in co-axial mount.

FIGS. 6a, 6b show a third embodiment of the arrangement according to this invention, in co-axial mount;

FIGS. 8a, 8b show a fourth embodiment of the arrangement according to this invention, in wave-guide solution;

FIGS. 9a, 9b, show a fifth embodiment of this invention, in wave-guide solution.

Figure 1:
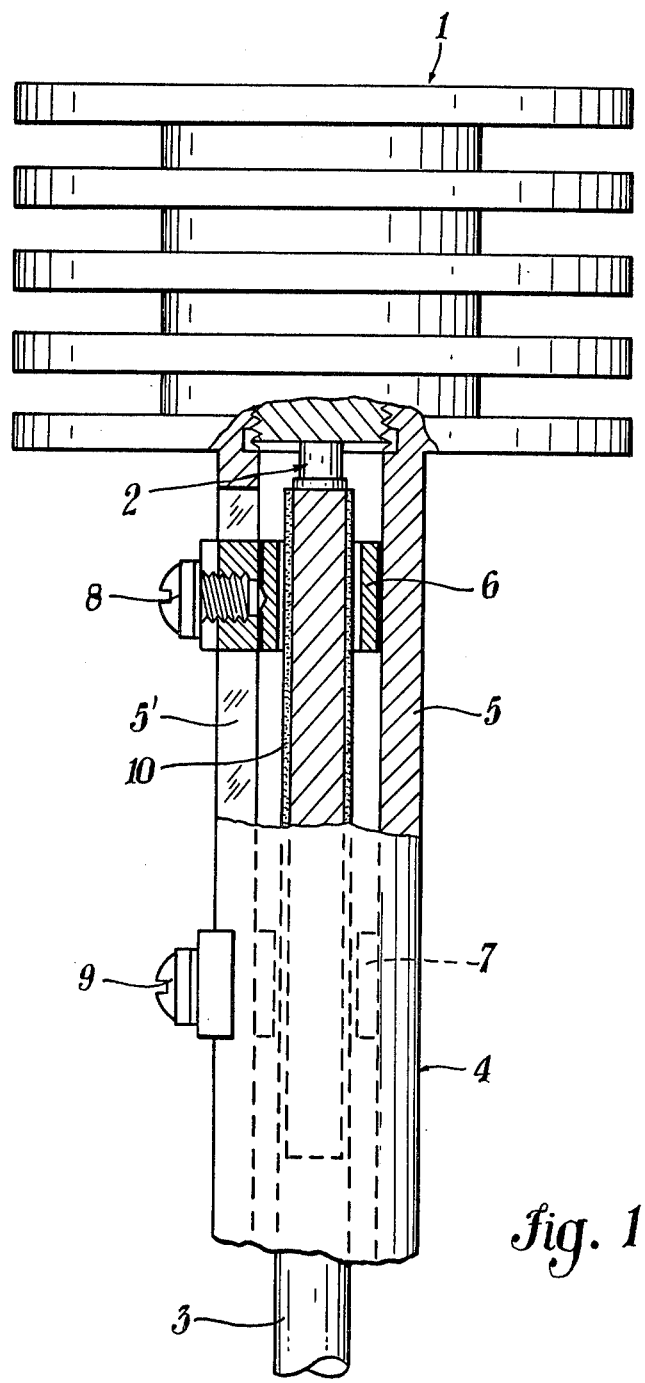
FIG. 1 is a partially sectional view of a first embodiment of the present invention, in co-axial mount.

With reference to the drawings, and particularly to FIG. 1, an IMPATT diode, generally denoted by 2 is mounted on a heat sink 1 with one terminal electrically and mechanically connected to the dissipator 1, while the other terminal is electrically and mechanically connected to the central conductor 3 of a co-axial line, generally denoted by 4 and having an outer conductor 5.

The co-axial line 4 is provided with a slot 5' in order to allow the positioning and fastening of tow (or more) impedance transformers which in the related case consist of two metal sleeves 6, 7 to which corresponds for instance the characteristic impedance of 15Ω while the characteristic impedance of the line 4 equals 50Ω. The metal sleeves 6, 7 can be fastened in their position by the screws 8, 9 so as to match the IMPATT diode 2 to the co-axial mount 4 at the operating microwave frequency.

About the central conductor 3, a ferrite sheath 10 is mounted, with an internal diameter of 3 mm, with an outer diameter of 3.8 mm and 70 mm long.

Figure 2:
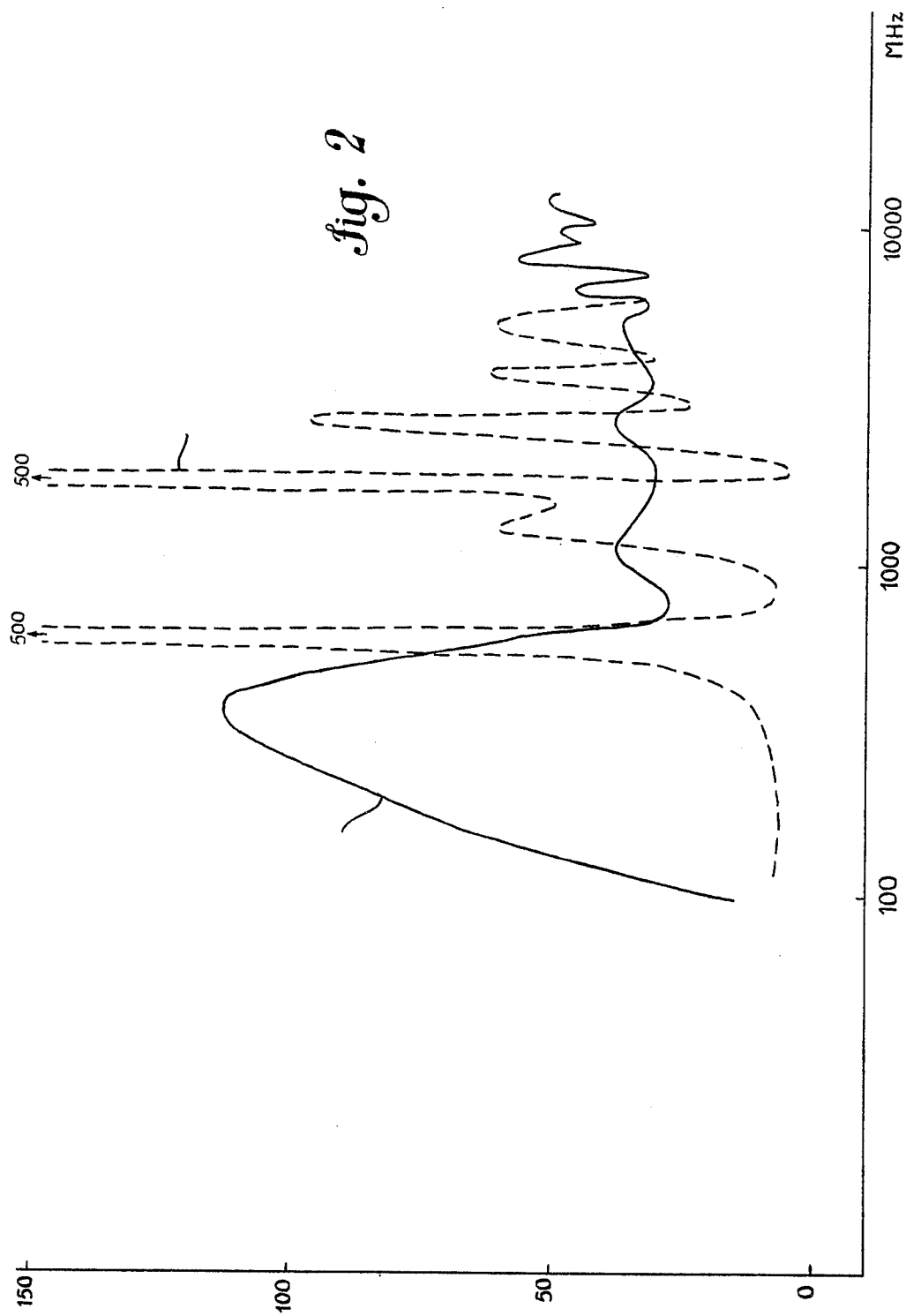
FIG. 2 is a chart of real impedance components seen from the terminals of the diode, with respect to the arrangement of FIG. 1.

The increase of microwave insertion loss due to the ferrite 10 is entirely neglectable, while the low-frequency resistance which can be measured at the point where the diode is mounted is shown by a continuous line in the chart of FIG. 2, versus the frequency. The dotted line of FIG. 2 shows, on the contrary, what would be the behaviour of the resistance versus the frequency, in the absence of the ferrite sheath 10.

Figure 3:
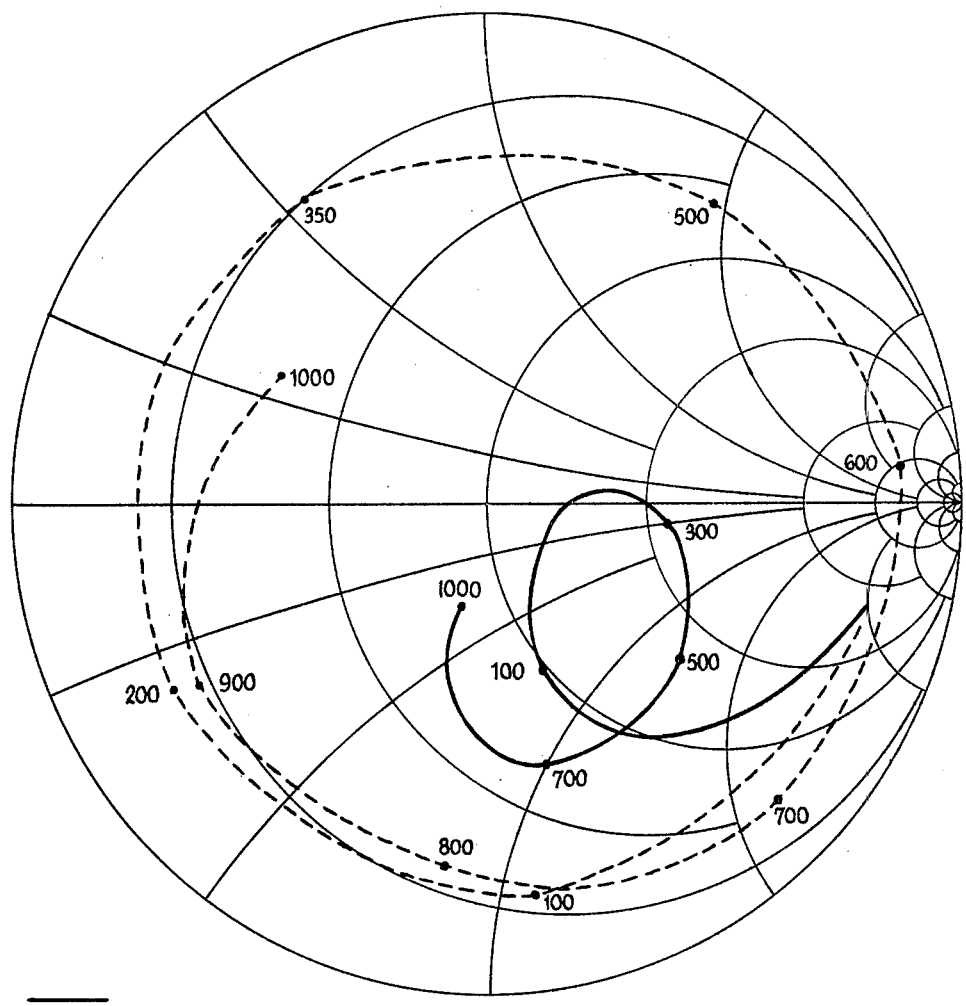
FIG. 3 is a Smith chart with respect to the arrangement of FIG. 1.

The low-frequency behaviour is shown by the continuous line in the Smith chart shown in FIG. 3. This Smith diagram of FIG. 3 is normalized with respect to the resistance $R_{sc}$. The term $R_{sc}$ is a value which has the dimensions of a resistance and is defined as "space charge resistance" and it is deduced by the slope of the static characteristic V, I of the IMPATT diode in the breakdown zone and at constant temperature. As in this zone said characteristic is practically linear, the term $R_{sc}$ is a constant which depends solely upon the properties of the semiconductor with which the diode is built.

For a certain number of tested diodes said resistance $R_{sc}$ appeared to be 50Ω. Therefore the Smith chart shown in FIG. 3 is normalized with respect to 50Ω.

It is possible to ascertain that the related oscillator will remain free from spurious oscillations until the modulus R of the negative resistance of the diode will take the value $R = 88Ω$ applying the Brackett theory on the oscillations (see cited ref.) The process consists in: plotting on the Smith chart the locus $a$ of the impedance seen in low frequency and normalized at the value $R_{sc}$; considering the set of straight lines perpendicular to the axis of the real impedances (axis of abscissae) starting from the straight line intersecting the axis of abscissae at the point $R + 0$; selecting the first straight line of the set resulting tangent to $a$. This will define a value of normalized resistance $R/R_{sc}$ (read on the axis of abscissae). The value $R$ - $/R_{sc}$ of the modulus of the maximum negative resistance (normalized at $R_{sc}$) which the diode can present, without the occurrence of low frequency oscillation (whatever be the microwave circuit on which it is closed) is given by the formula $$R\text{-}/R_{sc} = 1 + R/R_{sc}$$

The described process a valid when the value R - maximum is to be found (compatible with the stability of the low frequency circuit) placing no limitation for the radiofrequency circuit (namely to the coupling diode-microwave circuit). For the purpose of a comparison between the various circuits, this hypothesis can be admitted.

In an actual design, it could be too conservative, and it would be necessary to utilize a generalizing criterion thereof.

FIG. 3 shows in dotted line the locus of the resistance as seen from the diode when the ferrite sheath 10 on the central conductor is lacking, leaving unchanged all other elements. In this case the oscillator will remain free from spurious oscillations until the modulus of the negative rsistance R will be equal to 57Ω. It is evident that, as R increases when the power output increases, the system according to the present invention allows the possibility of obtaining with no risk of spurious oscillations, a reater microwave power.

Further embodiments of this invention will be now described.

With reference to FIG. 4, there has been shown a co-axial structure similar to that of FIG. 1, wherein the same reference numbers of FIG. 1, denote corresponding parts. In this case the co-axial conductor 3 is interrupted at 20, and in this zone is inserted a co-axial element comprising a relatively thin conductor 12 (0.5 mm diameter) surrounded by a little cylinder of ferrite 22 of the above specified type.

The length of the conductor 21 and therefore of the ferrite cylinder 22 is about 40 mm. The cylinder 22 is surrounded by a cylindrical metal wall 23, 24 forming the extension of the co-axial conductor 3 up to the 0.5 mm wide gap 20.

Figure 5:
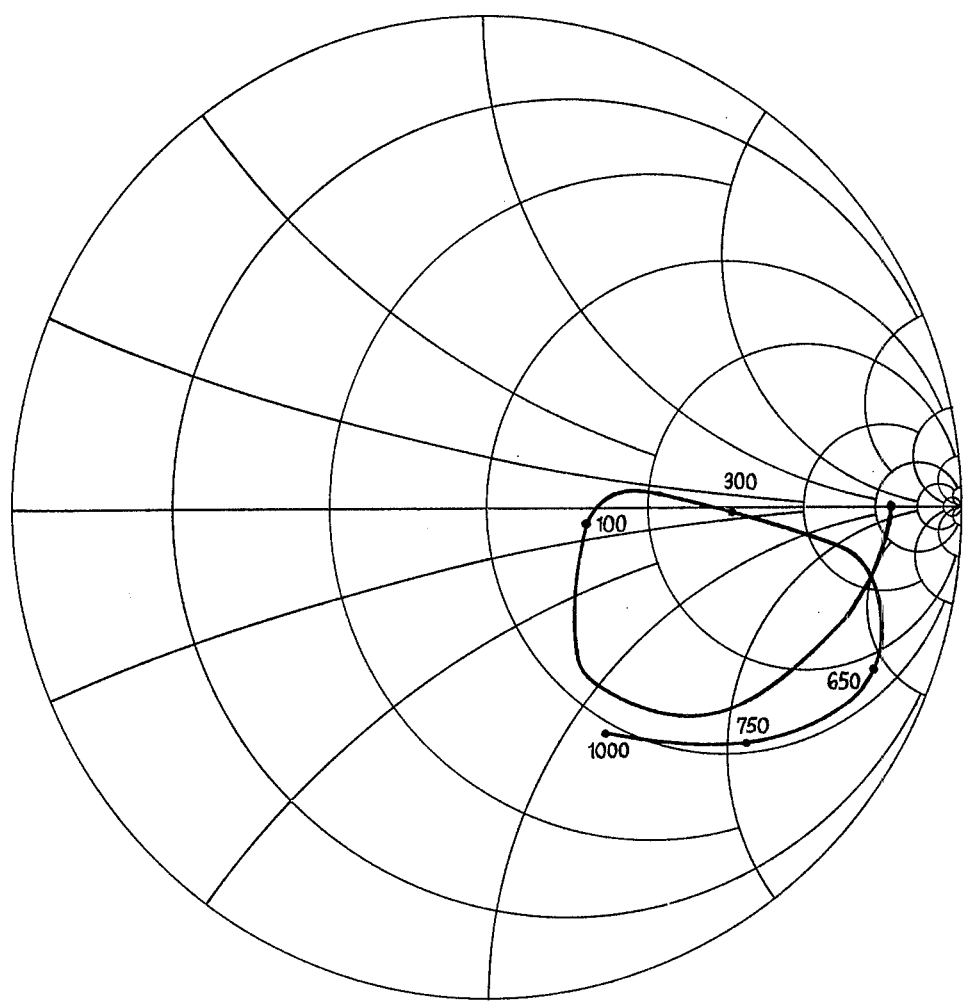
FIG. 5 is a Smith chart related to the arrangement of FIG. 4.

The FIG. 5 shows the associated Smith chart for the low frequencies up to 1000 MHz where it may be noted that for said frequencies the resistance of the circuit is very high, whereby an effective suppression of the spurious oscillations will be obtained. By the process like that followed with reference to FIG. 4, it is noted that in this case the oscillator will remain free from spurious oscillations until the modulus of the negative resistance R will be equal to about 120Ω.

FIG. 6 shows a futher co-axial structure similar under several aspects to the structure as shown in FIGS. 1 and 4 wherein a solution has been adopted gathering the solutions singularly applied in said FIGS. 1 and 4.

Figure 7:
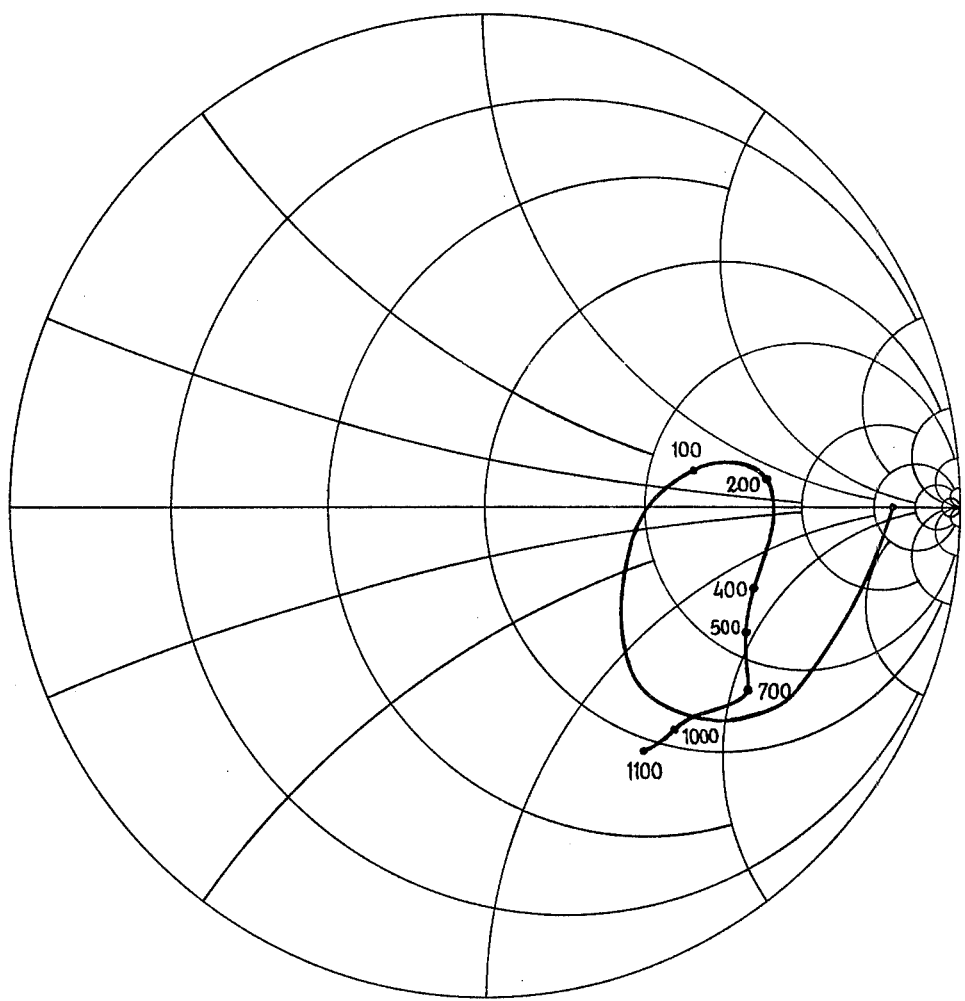
FIG. 7 is a Smith chart related to the arrangement of FIG. 6.

The FIG. 7 shows the Smith chart related to the low frequencies (up to 1100 MHz) for the structure as shown in FIG. 6. The operation in this case appears to be stable until R = 140Ω.

FIG. 8 shows the arrangement according to this invention when applied to a wave-guide oscillator. A portion 50 of wave guide is rigid with the flange 51. In the cavity as defined by the portion of wave guide 50 a metal support 52 is provided whereon the IMPATT diode 53 is mounted. One of the terminals of said IM- PATT diode is connected to ground through said support 52, while the other terminal is connected to the central conductor 54 of the co-axial structure 55. The conductor 54 is surrounded by a tubular ferrite sheath 56. The structure formed by the conductor 54 and the ferrite sheath 56 is held in position on the diode 53 by a dielectric element 57. The co-axial structure 55 is 6 cms. long, corresponding to two wave lengths at the operation microwave frequency of the oscillator. Thus on the wall of the cavity as defined by the portion 50 of the wave guide, a very low reactance will appear at said operation frequency.

FIG. 9 shows a futher embodiment forming a modification of the structure as shown in FIG. 8.

In the structure of FIG. 9, the dielectric element which was denoted by 57 in FIG. 8, is replaced by a choke comprising a cylinder 70 of ferrite surrounded in turn by a thin cylinder 71 of dielectric material.

Some typical applications of the arrangement according to the present invention are all applications wherein a RF power is needed, having such a power and being located in such a band, as to be obtained by an IMPATT diode used as an oscillator. Two typical applications are as follows:

Frequency tuned oscillator for radio relays (locked amplifier). In this application the necessary ower of few watts, can be doubtless obtained by an IMPATT diode.

Oscillator for phased array active antenna transmitters. Also for this application the oscillator must be synchronized, and generally pulse modulated.

The system according to this invention is furthermore useful in all cases when the oscillator must satisfy particularly severe performances under various standpoints (tuning band, absence of critical adjustment, etc.).

Finally the arrangement according to this invention will be particularly useful in all cases when the oscillator must be adjusted, gauged or checked on the field.

Having thus described the present invention, what is claimed is:

1. A stabilization system for an impatt-diode microwave oscillator comprising a power supply feed conductor having a substantially filamentary conducting element; support means for electrically and mechanically supporting an impatt-diode, said support means having a return conductor for the diode and a thermal dissipator and forming one terminal of a transmission line; and a ferrite member inductively associated with said power supply feed conductor and adjacent said support means to be in the immediate proximity of the impatt-diode where the electromagnetic field in the operating oscillation mode and at the operating frequency is intense, said ferrite member having a longitudinal size that is great with respect to the transverse size thereof and being formed of a material causing said ferrite member to have negligible losses at the microwave oscillator operating frequencies and high losses at frequencies ten or more times lower than the microwave oscillator operating frequencies.

2. A system as claimed in claim 1 in which said support means forms one terminal of a co-axial line and said power supply feed conductor consists of the central conductor of said co-axial line and is surrounded over a portion thereof by said ferrite.

3. A system as claimed in claim 2 in which said power supply feed conductor is thinned along a portion surrounded by said ferrite, said system further comprising two metal cylindrical elements surrounding said thinned portion, located so as to maintain the nominal diameter of said central conductor of the co-axial line, in electric contact on the remote ends with said central conductor, and insulated on the near ends.

4. A system as claimed in claim 3 further comprising a ferrite sheath mounted on said thinned portion of said central conductor.

5. A system as claimed in claim 1 improvement in which said support means forms the termination of a wave guide.

6. A system as claimed in claim 5 in which said ferrite is within a co-axial structure, the conductor internal to said ferrite being connected to the impatt-diode.

7. A system as claimed in claim 1 in which said support means forms the termination of a transmission line substantially of the TEM propagation type, and said power supply feed conductor consists of the conductor element of said transmission line and is associated at least for a portion of its length with said ferrite.

* * * * *